United States Patent [19]

Ozaki et al.

[11] Patent Number: 5,028,976
[45] Date of Patent: Jul. 2, 1991

[54] COMPLEMENTARY MOS INTEGRATED CIRCUIT DEVICE

[75] Inventors: Masaharu Ozaki, Yokohama; Takao Yonehara, Atsugi, both of Japan

[73] Assignee: Canon Kabushiki Kaisha, Tokyo, Japan

[21] Appl. No.: 529,706

[22] Filed: May 29, 1990

Related U.S. Application Data

[63] Continuation of Ser. No. 449,396, Dec. 7, 1989, abandoned, which is a continuation of Ser. No. 107,469, Oct. 13, 1987, abandoned.

[30] Foreign Application Priority Data

Oct. 17, 1986 [JP] Japan .................................. 61-246811

[51] Int. Cl.$^5$ ....................... H01L 27/02; H01L 29/04
[52] U.S. Cl. ......................................... 357/42; 357/59; 357/60; 437/56; 437/83
[58] Field of Search ...................... 357/59, 60, 42, 4; 437/83

[56] References Cited

U.S. PATENT DOCUMENTS

| | | | |
|---|---|---|---|
| 4,476,475 | 10/1984 | Naem et al. | 357/59 E |
| 4,487,635 | 12/1984 | Kugimiya et al. | 357/59 E |
| 4,593,453 | 6/1986 | Tam et al. | 357/59 E |
| 4,603,341 | 7/1986 | Bertin et al. | 357/59 E |
| 4,651,408 | 3/1987 | MacElwee et al. | 357/59 E |
| 4,679,299 | 7/1987 | Szluk et al. | 357/59 E |
| 4,686,758 | 8/1987 | Liu et al. | 357/59 E |
| 4,800,527 | 1/1989 | Ozaki et al. | 357/23.6 |
| 4,866,291 | 9/1989 | Shimada et al. | 357/23.7 |

FOREIGN PATENT DOCUMENTS

| | | | |
|---|---|---|---|
| 0252757 | 1/1988 | European Pat. Off. | |
| 0076101 | 4/1983 | Japan | 357/4 |
| 0021553 | 2/1985 | Japan | 357/59 E |
| 0281335 | 9/1988 | Japan | 437/83 |
| 0239928 | 10/1988 | Japan | 437/83 |
| 0239932 | 10/1988 | Japan | 437/83 |
| 0239935 | 10/1988 | Japan | 437/83 |
| 0281426 | 11/1988 | Japan | 437/83 |

OTHER PUBLICATIONS

Epitaxial Lateral Overgrowth of Silicon Over Steps of Thick SiO$_2$, Zingg et al., Jun. 1981.
The Nucleation of CVD Silicon on SiO$_2$ and Si$_3$N$_4$ Substrates, W. Claassen et al., Jun. 1981.
Orientation Controlled SOI by Line-Shaped Laser-Beam Seeded Lateral Epitaxy for CMOS Stacking, M. Ohkura et al., Aug. 1981.

*Primary Examiner*—Eugene R. LaRoche
*Assistant Examiner*—Michael B. Shingleton
*Attorney, Agent, or Firm*—Fitzpatrick, Cella, Harper & Scinto

[57] ABSTRACT

A complementary MOS integrated circuit device has an MOS transistor of one conductivity type formed on a semiconductor substrate and an MOS transistor of another conductivity type opposite to the one conductivity type formed on the MOS transistor of one conductivity type through a separate layer. A dissimilar material whose nucleation density is sufficiently larger than that of the material of the separate layer and which is fine enough so that only a single nucleus of a semiconductor layer material grows is provided on the separate layer. The MOS transistor of the opposite conductivity type is formed in a monocrystalline semiconductor layer or substantial monocrystalline semiconductor layer provided by growing around the single nucleus formed on the hetero material.

13 Claims, 8 Drawing Sheets

COMPLEMENTARY MOS INTEGRATED CIRCUIT DEVICE

This application is a continuation of application Ser. No. 07/449,396 filed Dec. 7, 1989 which is a continuation of application Ser. No. 07/107,469 filed Oct. 13, 1987.

BACKGROUND OF THE INVENTION

1. Field of the Invention

The present invention relates to a complementary MOS integrated circuit device and, more particularly, to a complementary MOS integrated circuit device having an MOS transistor of one conductivity type formed on a semiconductor substrate and an MOS transistor of another conductivity type opposite to one conductivity type formed on the MOS transistor of one conductivity type through a separate layer.

2. Related Background Art

Hitherto, in a complementary MOS integrated circuit device, in general, on a silicon monocrystalline substrate (hereinafter, referred to as a silicon substrate) of the first conductivity type, a diffusion layer of the second conductivity type opposite to the first conductivity type of the silicon substrate is partially formed, an MOS transistor of the first conductivity type is formed on the diffusion layer of the second conductivity type, and an MOS transistor of the second conductivity type is formed on the silicon substrate of the first conductivity type.

An example of a constitution of such a conventional complementary MOS integrated circuit device will be explained. When an N-type silicon substrate is used, a first P-type diffusion layer called a P well is formed in the N-type silicon substrate and thereafter, a second P-type diffusion layer serving as drain/source of the P channel MOS transistor is formed in the N-type silicon substrate, and a first N-type diffusion layer serving as drain/source of an N channel MOS transistor is formed in the first P-type diffusion layer.

The foregoing complementary MOS integrated circuit device has a serious problem such that a latch-up occurs because a thyristor is constituted by a parasitic bipolar transistor which is formed due to the constitution of this device. In addition, this device has a problem such that the degree of integration is small since both of the P channel MOS transistor and the N channel MOS transistor are two-dimensionally laterally arranged. Various studies and improvements have been made to solve such problems. As one of them, there has been proposed a method whereby an N channel MOS transistor is formed on a P-type silicon substrate and thereafter, the N channel MOS transistor is covered by an insulative layer, a P channel MOS transistor is formed on a thin film formed on the insulative layer, and a complementary MOS integrated circuit of a multi-layer is formed. However, in the conventional thin film forming technique, in general, only a thin film of amorphous silicon or polysilicon can be grown on the insulative layer. Therefore, hitherto, there is used a method whereby a P channel MOS transistor is formed on a polysilicon thin film or a silicon thin film which has once grown is dissolved by a laser beam or the like so as to form a monocrystal.

However, the foregoing methods also have the following problems.

First, the method whereby the P channel MOS transistor is formed on the polysilicon thin film has a problem such that the channel mobility is remarkably smaller than that in the case where it is formed on a monocrystal. On the other hand, according to the method whereby the silicon thin film is dissolved to form a monocrystal, after an N channel MOS transistor was formed on the silicon substrate, the silicon thin film is dissolved. Thus, the temperature of the N channel MOS transistor rises and impurities are redistributed in the diffusion layer which has once been formed. Such a redistribution of the impurities which occurs after the N channel MOS transistor was formed causes the characteristic to remarkably deteriorate and becomes a serious problem in the fine MOS transistor which has recently been realized.

SUMMARY OF THE INVENTION

It is an object of the present invention to solve the foregoing problems and to provide a complementary MOS integrated circuit device in which the latch-up is prevented and the high integration and high mobility can be realized.

For this purpose, a complementary MOS integrated circuit device according to the present invention has an MOS transistor of one conductivity type formed on a semiconductor substrate and an MOS transistor of another conductivity type opposite to one conductivity type formed on the MOS transistor of one conductivity type through a separate layer, wherein a dissimilar material whose nucleation density is sufficiently larger than that of the material of the separate layer and which is fine enough so that only a single nucleus of the semiconductor layer material grows is formed on the separate layer, and the MOS transistor of the opposite conductivity type is formed in the monocrystalline semiconductor layer or substantially monocrystalline semiconductor layer provided by growing around the single nucleus formed on the nucleation surface of the dissimilar material.

In this manner, the dissimilar material whose nucleation density is larger than that of the material of the separate layer and which is fine enough so that only a single nucleus of the semiconductor layer material grows is provided on the separate layer, and the monocrystalline semiconductor layer formed by growing around the single nucleus formed on the nucleation surface of the dissimilar material or the substantially monocrystalline semiconductor layer is provided, thereby constituting a complementary MOS integrated circuit device having a multi-layer structure.

Namely, according to the complementary MOS integrated circuit device of the invention, the complementary MOS transistor is not formed on the same semiconductor substrate, so that a latch-up does not occur and the degree of integration can be improved. In addition, since the monocrystalline semiconductor or the substantially monocrystalline semiconductor grows around the fine dissimilar material on the separate layer, no crystal lattice defect exists and the diffusion or the like of aluminum of the wiring electrodes and impurities does not occur. Further, in the process to form the monocrystalline semiconductor on the separate layer, the ordinary semiconductor process is merely used as will be explained hereinafter and any particular process is not needed.

DESCRIPTION OF THE PREFERRED EMBODIMENTS

An embodiment of the present invention will be described in detail hereinbelow with reference to the drawings.

Figure 1:
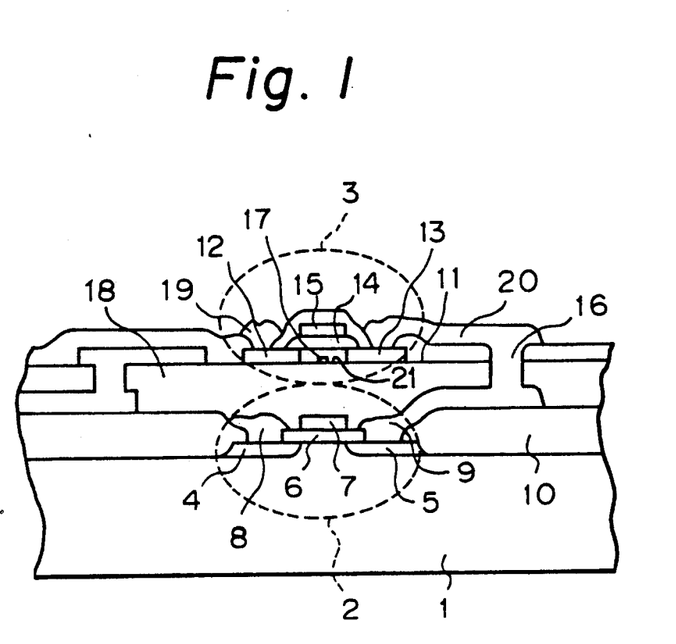
FIG. 1 is a schematic diagram showing an embodiment of a complementary MOS integrated circuit device of the invention.

FIG. 1 is a schematic diagram showing an embodiment of a complementary MOS integrated circuit device of the invention.

As shown in the diagram, an N channel MOS transistor 2 is formed on a P-type silicon substrate 1 serving as a semiconductor substrate. The N channel MOS transistors 2 are isolated by a field oxide film 10. A source region 4 and a drain region 5 are formed on the P-type silicon substrate 1. A gate electrode 7 is further formed over the source and drain regions 4 and 5 through a gate insulative layer 6. The source region 4 is connected to a wiring 8. The drain region 5 is connected to a wiring 9.

A P channel MOS transistor 3 is formed over the N channel MOS transistor 2 through a separate layer 18.

The P channel MOS transistor 3 is formed in the following manner. First, a nucleation portion 17 made of a dissimilar material whose nucleation density is sufficiently larger than that of the material of the separate layer 18 is formed on a deposition surface 11 on the separate layer 18. A monocrystalline region or a substantial monocrystalline region grows around a single nucleus formed in the nucleation portion 17, thereby forming a monocrystalline semiconductor layer or a substantial monocrystalline semiconductor layer. A source region 12, channel region 21 and a drain region 13 are formed in the monocrystalline semiconductor layer or substantial monocrystalline semiconductor layer. A gate electrode 15 is further formed over the source channel and drain regions 12, 21 and 13, respectively through a gate insulative layer 14. The source region 12 is connected to a wiring 19. The drain region 13 is connected to a wiring 20. The wiring 20 is connected to the wiring 9 via a through hole 16.

In this embodiment, the invention has the following features. Namely, the separate layer 18 is formed on the N channel MOS transistor 2. The monocrystalline semiconductor layer or substantial monocrystalline semiconductor layer is formed on the separate layer 18. The P channel MOS transistor 3 is formed by the monocrystalline semiconductor layer or substantial monocrystalline semiconductor layer. In this manner, the complementary MOS transistor is constituted. Namely, according to the invention, the N channel MOS transistor 2 is formed in the P-type silicon substrate 1. After the N channel MOS transistor 2 was formed, it is not subjected to a high temperature treatment. Therefore, as compared with the conventional N channel MOS transistor, the characteristic does not deteriorate. On the other hand, in the case of the P channel MOS transistor 3, since it is formed in the monocrystalline semiconductor layer or substantial monocrystalline semi-conductor layer, its channel mobility is 200 $cm^2/v.s.$ or more. The characteristic which is almost equal to that of the conventional P channel MOS transistor which is formed on a monocrystalline wafer is derived.

Figure 2:
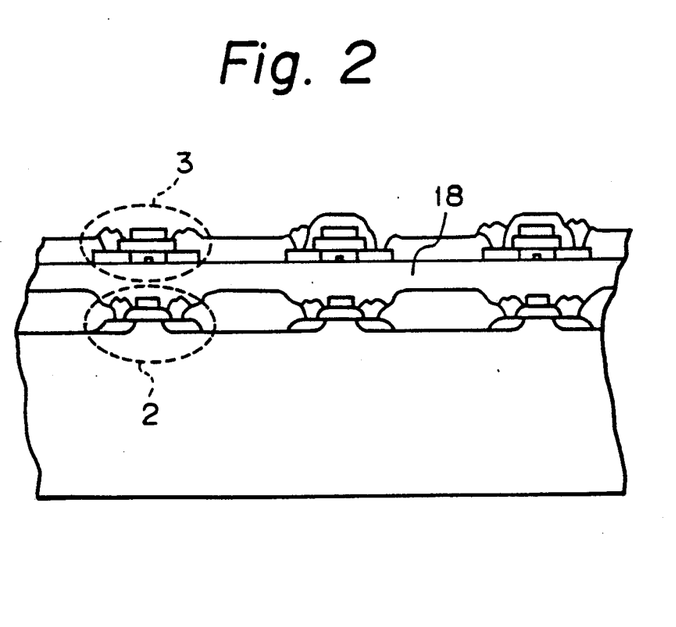
FIG. 2 is a schematic diagram showing an embodiment of a complementary integrated circuit device of the invention when a number of N channel MOS transistors and a number of P channel MOS transistors are arranged.

FIG. 2 is a schematic diagram showing an embodiment of a complementary integrated circuit device of the invention in the case where a number of N channel MOS transistors and a number of P channel MOS transistors are arranged.

As shown in the diagram, in a manner similar to the foregoing embodiment, the N channel MOS transistors 2 are isolated by the field oxide layer 10 and formed on the P-type silicon substrate 1, respectively. The P channel MOS transistors 3 are formed through the separate layer 18, respectively.

In the foregoing embodiment, the N channel MOS transistor has been formed in the P-type silicon substrate and the P channel MOS transistor has been formed in the monocrystalline semiconductor layer or substantial monocrystalline semiconductor layer. However, on the contrary, it is also possible to provide the P channel MOS transistor in the N-type silicon substrate and to provide the N channel MOS transistor in the monocrystalline semiconductor layer or substantial monocrystalline semiconductor layer.

A method of manufacturing the complementary MOS integrated circuit device of the invention will now be described hereinbelow. In the following explanation, a method of manufacturing the N channel MOS transistor and the P channel MOS transistor is omitted since the well-known MOS integrated circuit manufacturing technique can be used. Only a method of forming the monocrystalline semiconductor layer or substantial monocrystalline semiconductor layer will be described.

First, a selective deposition method of selectively forming a deposition film on the deposition surface will be explained. The selective deposition method is the method whereby a thin film is selectively formed on the substrate by use of the differences between materials with respect to factors such as surface energy, attachment coefficient, peel off coefficient, surface diffusion rate, etc. which influence the formation of a nucleus in the thin film forming process.

Figure 3A:
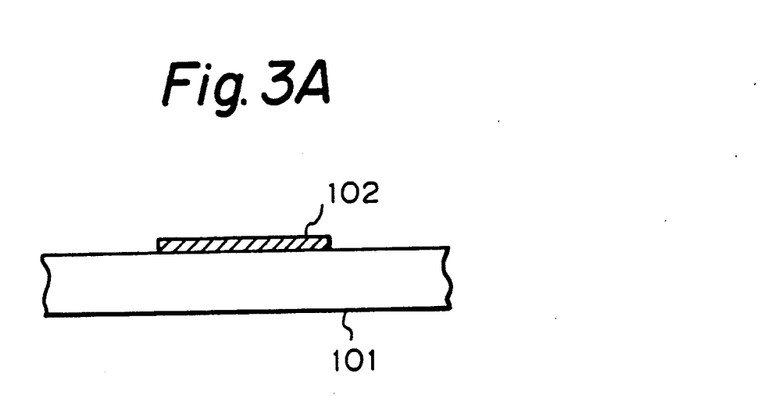
FIGS. 3(A) and 3(B) are explanatory diagrams of a selective deposition method.
Figure 3B:
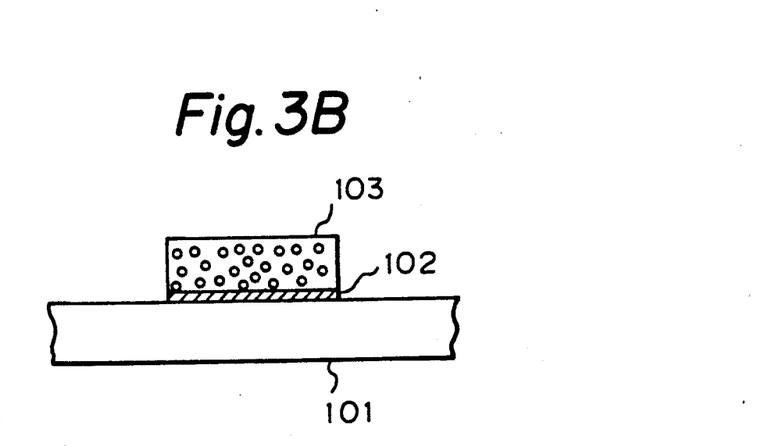

FIGS. 3(A) and 3(B) are explanatory diagrams of the selective deposition method.

First, as shown in FIG. 3(A), a thin film 102 is formed in a desired portion on a substrate 101. The thin film 102 is made of a material whose factors mentioned above are different from those of the substrate 101. When a thin film made of a proper material is deposited under the proper deposition condition, it is possible to cause a phenomenon such that a thin film 103 grows only on the thin film 102 and does not grow on the substrate 101. By use of this phenomenon, it is possible to grow the thin film 103 which was shaped in a self-aligning manner. The lithography process using a resist as in the conventional method can be omitted.

As the materials capable of performing the deposition by such a selective forming method, for example, $SiO_2$ may be used for the substrate 101; Si, GaAs, or $Si_3N_4$ may be used for the thin film 102; and Si, W, GaAs, InP, etc. may be used for the thin film 103 which is deposited.

Figure 4:
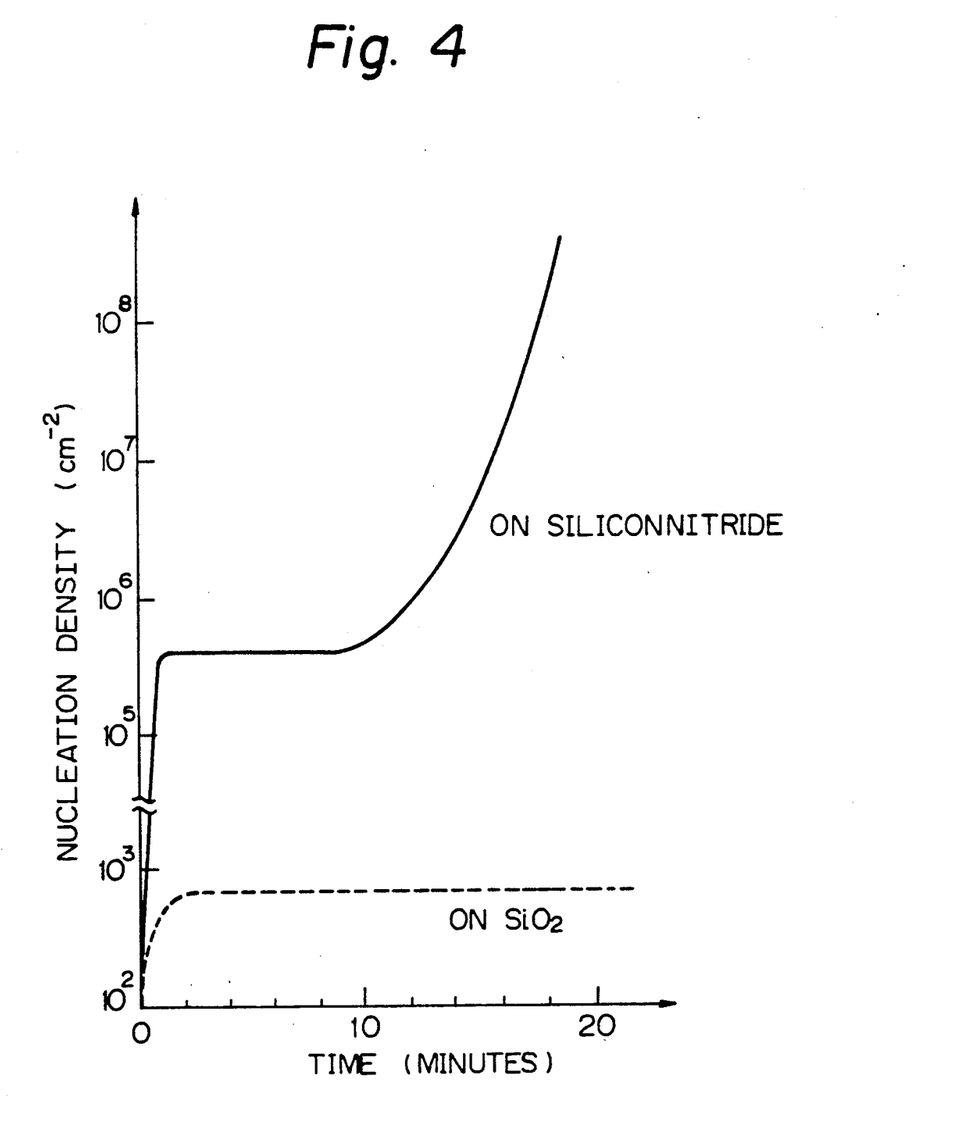
FIG. 4 is a graph showing time-dependent changes of tee nucleation densities of the deposition surface of $SiO_2$ and of the deposition surface of silicon nitride.

FIG. 4 is a graph showing time-dependent changes of the nucleation densities of the deposition surface of $SiO_2$ and of the deposition surface of silicon nitride.

As shown in the graph, after the deposition was started, the nucleation density on $SiO_2$ is soon saturated to a value of $10^3$ cm$^{-2}$ or less and its value hardly changes even after the elapse of twenty minutes.

On the other hand, the nucleation density on silicon nitride ($Si_3N_4$) is once saturated to a value of about $4 \times 10^5$ cm$^{-2}$ and thereafter, it hardly changes for about ten minutes. However, it suddenly increases thereafter. This measurement example shows the case where the $SiCl_4$ gas was diluted by the $H_2$ gas and the thin film was deposited by the CVD method under the conditions of a pressure of 175 Torr and a temperature of 1000° C. The similar function can be also obtained by adjusting the pressure, temperature, and the like by use of the reactive gas such as $SiH_4$, $SiH_2Cl_2$, $SiHCl_3$, $SiF_4$, or the like. In addition, the similar function can be also derived by the vacuum deposition method.

In this case, although the formation of a nucleus on $SiO_2$ hardly causes a problem, by adding the HCl gas into the reactive gas, the formation of a nucleus on $SiO_2$ can be further suppressed and the deposition of Si on $SiO_2$ can be perfectly eliminated.

Such a phenomenon is largely influenced by the differences of the attachment coefficient, peel off coefficient, surface diffusion coefficient, etc. of the surfaces of the materials of $SiO_2$ and silicon nitride to Si. However, it can be considered that $SiO_2$ reacts by the Si atom itself and silicon monoxide having a high vapor pressure is produced, so that $SiO_2$ itself is etched and such an etching phenomenon does not occur on silicon nitride, and this fact also results in a cause of the occurrence of the selective deposition (T. Yonehara, S. Yoshioka, S. Miyazawa, "JOURNAL OF APPLIED PHYSICS", Vol. 53, page 6839, in 1982).

In this manner, by selecting $SiO_2$ and silicon nitride as the materials of the deposition surfaces and by selecting silicon as the material to be deposited, a large enough difference of the nucleation density can be obtained as shown in FIG. 4. Although $SiO_2$ is desirable as the material of the deposition surface, the nucleation density difference can be also obtained by use of $SiO_x$ without limiting to $SiO_2$ as such a material.

Obviously, the invention is not limited to these materials. It is sufficient to use a material such that the nucleation density difference is equal to or larger than the value of $10^3$ times as the nucleation density as shown in FIG. 4. A deposition film can be also sufficiently selectively formed by materials as will be explained hereinlater.

As another method of obtaining the nucleation density difference, regions having surplus ions of Si, N, etc. may be also formed by locally ion implanting Si, N, etc. into $SiO_2$.

By sufficiently forming a finely dissimilar material whose nucleation density is enough larger than that of the materials of the deposition surfaces so that only a single nucleus grows by use of the foregoing selective deposition method, a monocrystal can be selectively grown on only the portion where the fine dissimilar material exists.

Since the selective growth of the monocrystal is determined by the state of electrons on the deposition surface, particularly, by the state of a dangling bond, there is no need to use a bulk material as the material (e.g., $SiO_2$) of a low nucleation density. It is sufficient that such a material is formed on only the surface of an arbitrary material, substrate, or the like and constitutes the deposition surface.

FIGS. 5(A) to 5(D) are forming step diagrams showing an example of a method of forming a monocrystal. FIGS. 6(A) and 6(B) are perspective views of a substrate in FIGS. 5(A) and 5(D).

Figure 5A:
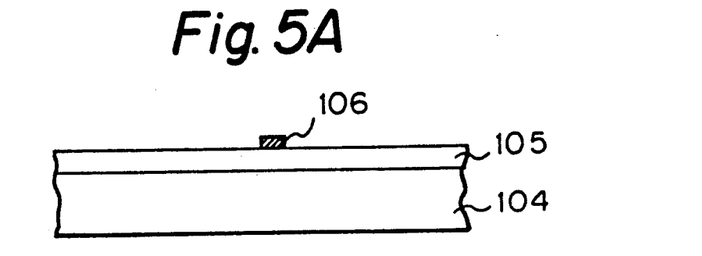
FIGS. 5(A) to 5(D) are forming step diagrams showing an example of a method of forming a monocrystal or a substantially monocrystal.
Figure 6A:
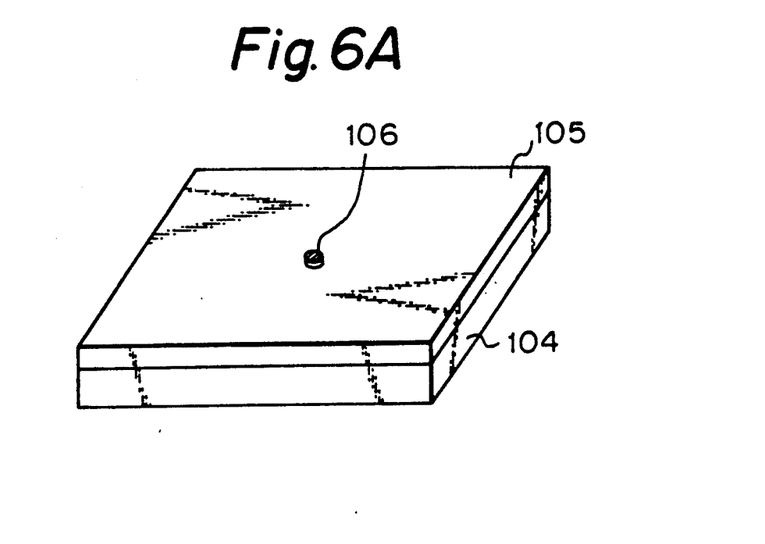
FIGS. 6(A) and 6(B) are perspective views of a substrate in FIGS. 5(A) and 5(D)
Figure 6B:
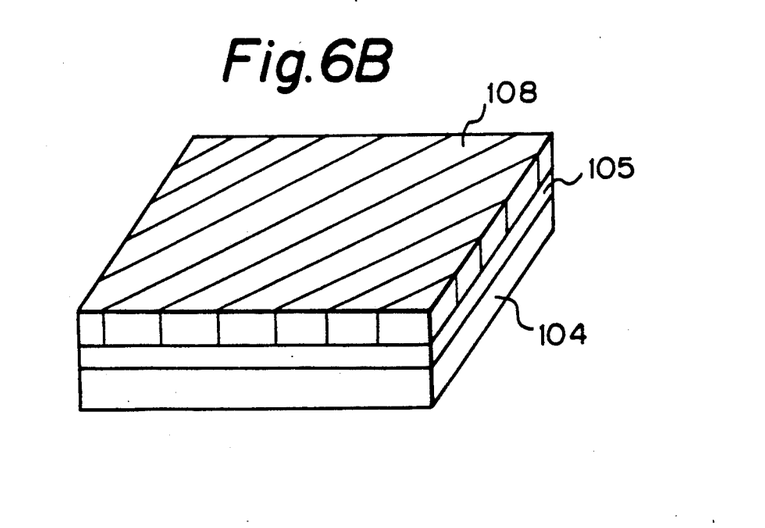

First, as shown in FIGS. 5(A) and 6(A), a thin film 105 of a small nucleation density capable of realizing the selective deposition is formed on a substrate 104. A dissimilar material of a large nucleation density is thinly deposited on the thin film 105 and is patterned by a lithography or the like, thereby forming a sufficiently fine dissimilar material 106 on the thin film 105. The size, crystal structure, and compositions of the substrate 104 can be arbitrarily set. A substrate on which functional devices were formed may be also used as the substrate 104. As mentioned above, on the other hand, the dissimilar material 106 also incorporates the modified regions having surplus ions of Si, N, etc. which are formed by ion implanting Si, N, etc. into the thin film 105.

Figure 5B:
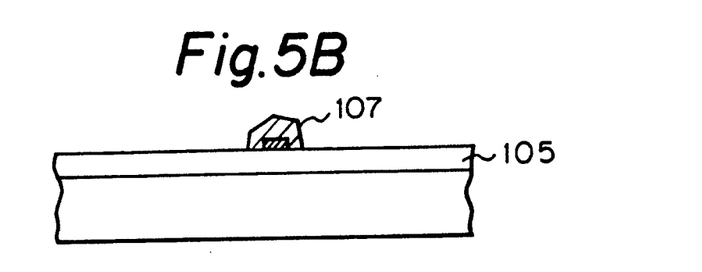

Next, a single nucleus of the thin film material is formed on only the hetero material 106 by the proper deposition condition. Namely, the dissimilar material 106 needs to be formed sufficiently finely so that only a single nucleus is formed. Although the size of dissimilar material 106 differs depending on the kind of material, it is sufficient to set the size to a value of a few microns or less. Further, the nucleus grows while keeping the monocrystalline structure or substantial monocrystalline structure and becomes an island-shaped monocrystal grain 107 as shown in FIG. 5(B). To form the island-shaped monocrystal grain 107, it is necessary to decide the conditions such that a nucleus is never formed on the thin film 105 as already mentioned above.

Figure 5C:
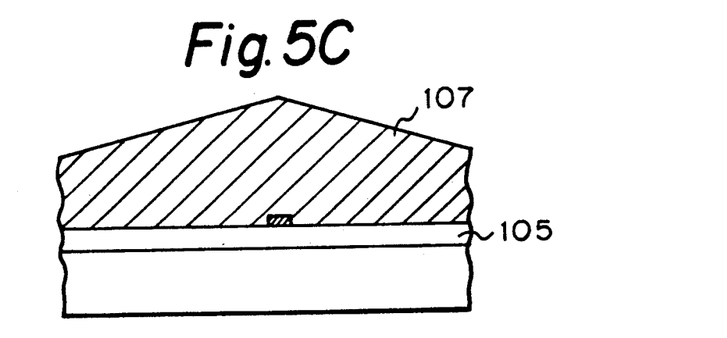

The island-shaped monocrystal grain 107 further grows around the dissimilar material 106 while keeping the monocrystalline structure or substantial monocrystalline structure and covers the whole thin film 105 as shown in FIG. 5(C).

Figure 5D:
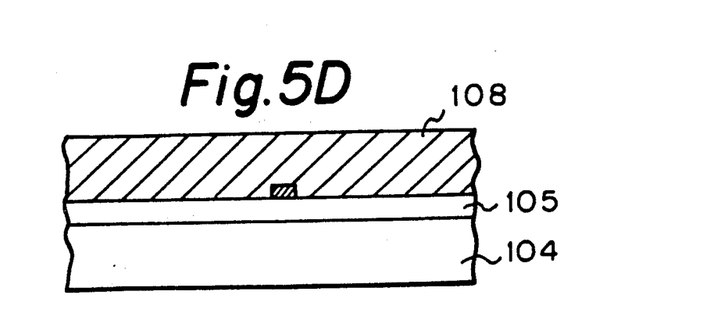

Subsequently, the monocrystal grain 107 is made flat by etching or polishing, thereby forming a monocrystalline layer 108 on the thin film 105, so that a desired device can be formed on the layer 108 as shown in FIGS. 5(D) and 6(B).

Since the thin film 105 as the material of the deposition surface is formed on the substrate 104, an arbitrary material can be used as the substrate 104 serving as the supporting member. Further, even in the case of a substrate such that functional devices or the like were formed on the substrate 104, a monocrystalline layer can be easily formed on this substrate.

Although the material of the deposition surface has been formed by the thin film 105 in the embodiment, a monocrystalline layer can be also similarly formed by directly using a substrate made of a material of a small nucleation density capable of realizing the selective deposition.

Practical Example

A practical method of forming the monocrystalline layer in the foregoing embodiments will now be described.

$SiO_2$ is used as the deposition surface material of the thin film 105. A quartz substrate may be also used. An $SiO_2$ layer may be also formed onto the surface of an arbitrary substrate such as metal, semiconductor, magnetic material, piezoelectric material, insulative material, etc. by use of sputtering method, CVD method, vacuum deposition method, etc. On the other hand, although $SiO_2$ is desirable as the material of the deposition surface, it is also possible to use $SiO_x$ (x is an arbitrary value).

A silicon nitride layer (in this case, $Si_3N_4$ layer) or a polycrystalline silicon layer is deposited as a dissimilar material on the $SiO_2$ layer 105 by a reduced pressure vapor phase growth method. The silicon nitride layer or polycrystalline silicon layer is patterned by the ordinary lithography technique or a lithography technique using X rays, electron beam, or ion beam, thereby forming a fine dissimilar material 106 of a diameter of a few microns or less, preferably, one $\mu$m or less.

Subsequently, Si is selectively grown on the substrate 11 by use of the mixed gases of HCl, $H_2$, and $SiH_2Cl_2$, $SiCl_4$, $SiHCl_3$, $SiF_4$, or $SiH_4$. The temperature of the substrate at this time falls within a range from 700° to 1100° C. and the pressure is about 100 Torr.

After an elapse of about tens of minutes, the monocrystalline silicon grain 107 grows around the fine dissimilar material 106 of silicon nitride or polycrystalline silicon on $SiO_2$. By setting the optimum growth condition, the grain 107 grows until a size of tens of $\mu$m or larger.

Subsequently, by making only Si flat by etching it by a reactive ion etching (RIE) due to the difference of the etching rates between Si and $SiO_2$, a polycrystalline silicon layer whose grain diameter was controlled is formed. Further, by eliminating the grain boundary portion, the island-shaped monocrystalline silicon layer 108 is formed. When the surface roughness of the monocrystal grain 107 is large, it is mechanically polished and thereafter, it is etched.

A field effect transistor was formed on the monocrystalline silicon layer 108 whose size is tens of $\mu$m or more and which doesn't include the grain boundary and which had been formed as explained above. Thus, this transistor exhibited the characteristic which is almost equal to that of the transistor formed on a monocrystalline silicon wafer.

On the other hand, since the monocrystalline silicon layer 108 is electrically isolated by $SiO_2$ from the adjacent monocrystalline silicon layer 108, even when complementary field effect transistors (C-MOS) are constituted, they are not interfered. On the other hand, since a thickness of active layer of the device is thinner than that in the case of using an Si wafer, the malfunction due to the charges in the wafer which are generated when irradiated, does not occur. Further, since the parasitic capacitance decreases, the high operational speed of the device can be realized. In addition, since an arbitrary substrate can be used, a monocrystalline layer can be cheaply formed on the substrate of a large area as compared with the case where the Si wafer is used. Moreover, since a monocrystalline layer can be also formed on other substrates of semiconductor, piezo-electric material, dielectric material, etc., a multi-function three-dimensional integrated circuit can be realized.

Compositions of silicon nitride

The material to obtain the sufficient nucleation density difference between the deposition surface material and the dissimilar material as mentioned above is not limited to $Si_3N_4$, but it is also possible to use silicon nitride having different compositions.

According to the plasma CVD method whereby a silicon nitride film is formed at low temperatures by dissolving the $SiH_4$ gas and $NH_3$ gas in the RF plasma, by changing the flow rate ratio of the $SiH_4$ gas and $NH_3$ gas, the composition ratio of Si and N in the silicon nitride film to be deposited can be largely changed.

Figure 7:
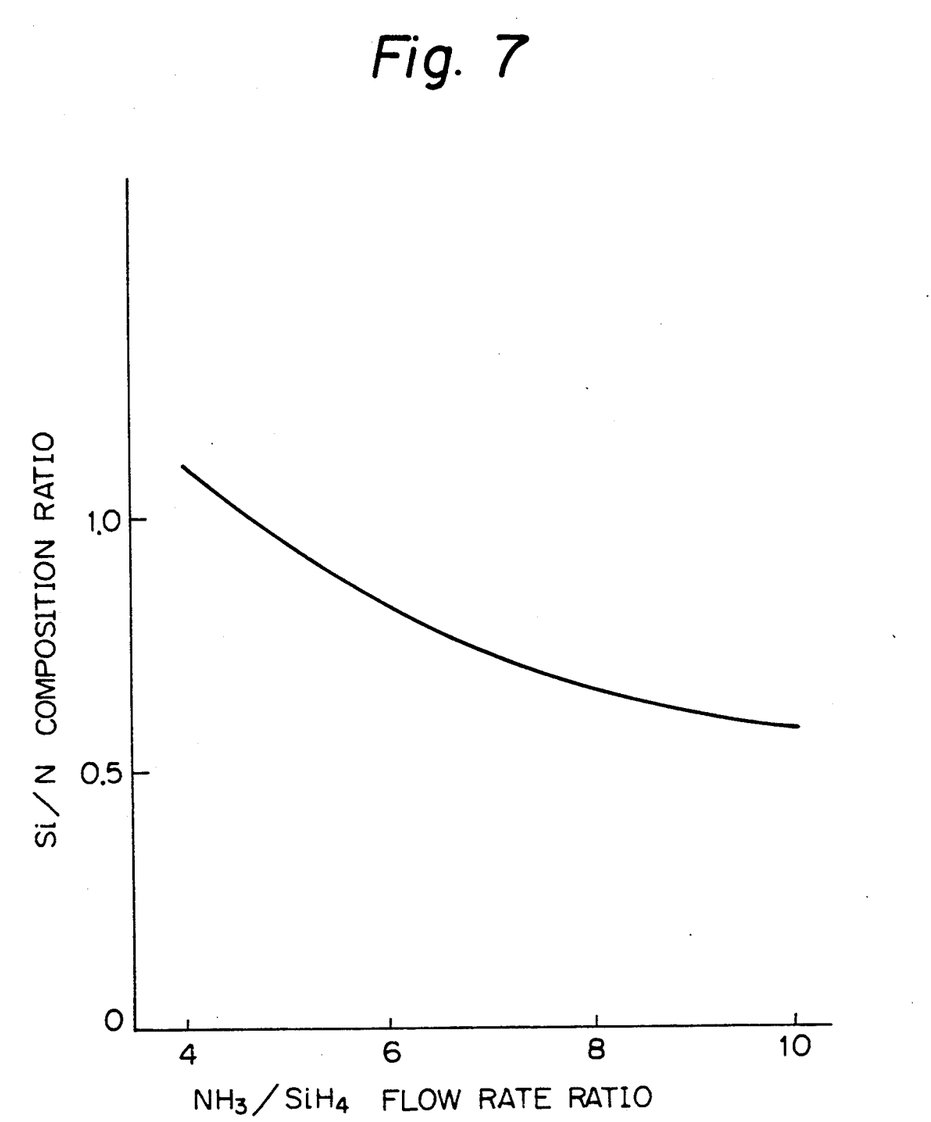
FIG. 7 is a graph showing the relation between the flow rate ratio of $SiH_4$ and $NH_3$ and the composition ratio of Si and N in the silicon nitride film formed.

FIG. 7 is a graph showing the relation between the flow rate ratio of $SiH_4$ and $NH_3$ and the composition ratio of Si and N in the silicon nitride film formed.

In the deposition condition at this time, the RF output was 175 W and the substrate temperature was 380° C. The flow rate of the $SiH_4$ gas was fixed to 300 cc/min and the flow rate of the $NH_3$ gas was changed. As shown in this graph, when the gas flow rate ratio of $NH_3/SiH_4$ was changed from 4 to 10, it has been found by an Auger electrospectral method that the Si/N ratio in the silicon nitride film changed from 1.1 to 0.58.

On the other hand, a silicon nitride film was formed by the reduced pressure CVD method by introducing the $SiH_2Cl_2$ gas and the $NH_3$ gas under the conditions of the reduced pressure of 0.3 Torr and the temperature of about 800° C. The compositions of this silicon nitride film were near $Si_3N_4$ (Si/N=0.75); the value of this composition ratio is the stoichiometric ratio.

On the other hand, in the case of the silicon nitride film which is formed by heat treating Si in ammonia or $N_2$ at a temperature of about 1200° C. (by a heat nitriding process), since it is formed under the thermal equilibrium, the composition ratio which is further close to the stoichiometric ratio can be obtained The silicon nitrides formed by the foregoing various kinds of methods were used as the deposition surface materials in which the nucleation density of Si is higher than that of $SiO_2$, and the nucleus of Si was grown. Thus, the difference of the nucleation densities occurs due to the composition ratio.

Figure 8:
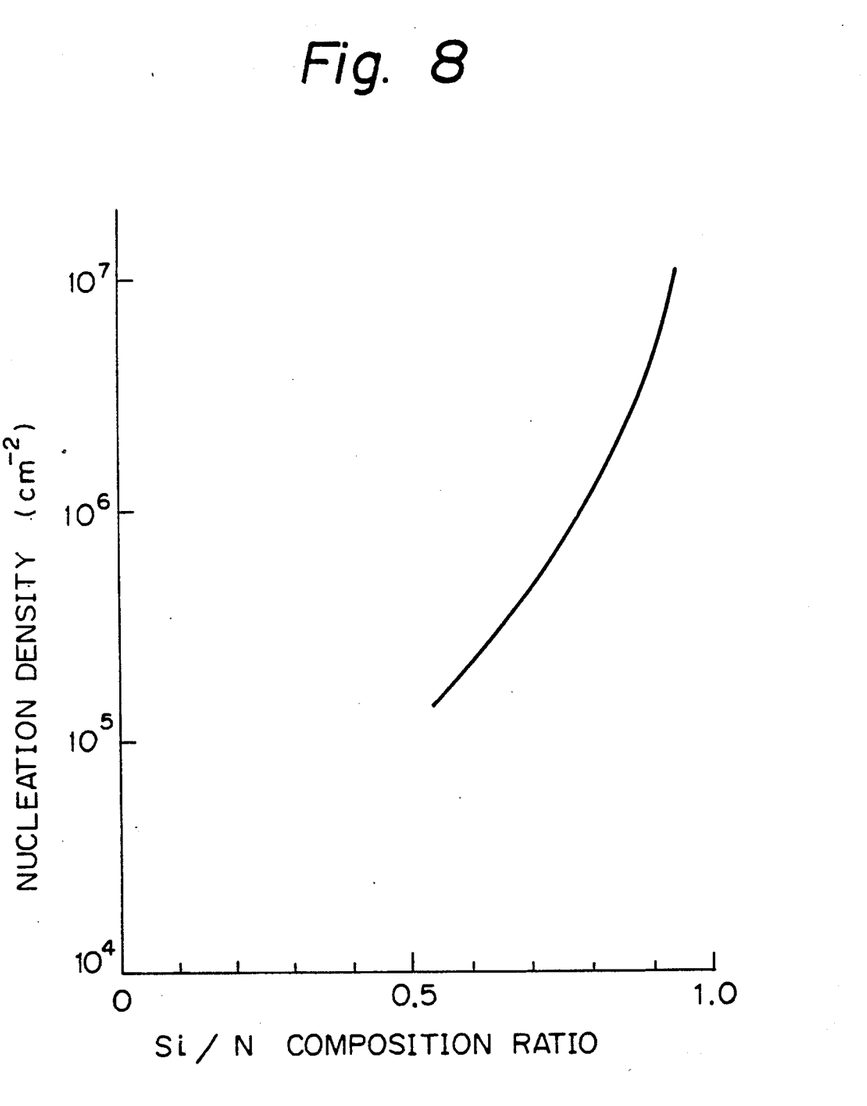
FIG. 8 is a graph showing the relation between the Si/N composition ratio and the nucleation density.

FIG. 8 is a graph showing the relation between the Si/N composition ratio and the nucleation density. As shown in the graph, by changing the compositions of the silicon nitride film, the nucleation density of Si which grows on this film largely changes. In the nucleus forming conditions at this time, the pressure of the $SiCl_4$ gas was reduced to 175 Torr and Si was produced by reacting with $H_2$ at 1000° C.

In this manner, by exposing, developing, and dissolving the nucleus forming portion due to the compositions of the silicon nitride, the $SiO_2$ surface is partially exposed.

Subsequently, by use of the $SiF_4$ gas as the source gas, the Si ions are implanted into the $SiO_2$ surface at a density within a range from $1 \times 10^{16}$ to $1 \times 10^{18}$ cm$^{-2}$ at a voltage of 10 keV. The projection range due to this is 114 Å and the Si concentration on the $SiO_2$ surface reaches a value of $10^{22}$ cm$^{-3}$ or less Since $SiO_2$ is inherently amorphous, the region into which the Si ions were implanted is also amorphous.

To form the modified region, the ion implantation can be also performed using a resist as a mask. However, the Si ions which were focused without using a resist mask may be also implanted into the SiO₂ surface using the focused ion beam technique.

After the ions were implanted in this manner, by eliminating the resist, the modified region having surplus Si is formed on the SiO₂ surface. Then, Si is vapor phase grown on the SiO₂ deposition surface on which the modified region was formed.

Figure 9:
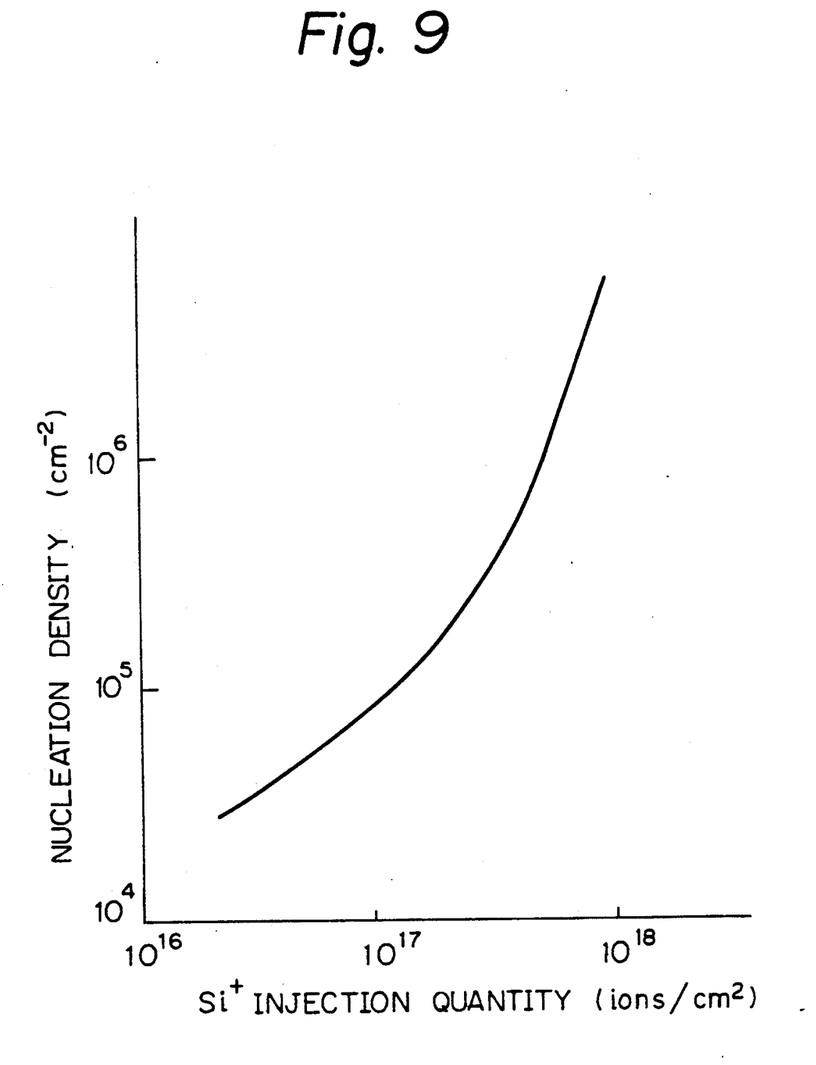
FIG. 9 is a graph showing the relation between the injection quantity of Si ions and the nucleation density.

FIG. 9 is a graph showing the relation between the injection quantity of Si ions and the nucleation density.

As shown in the graph, it will be understood that the nucleation density increases as the injection quantity of the Si⁺ ions is large.

Therefore, by sufficiently finely forming the modified region, a single nucleus of Si can be grown using the modified region as a dissimilar material. A monocrystal can be grown as mentioned above.

The technique to sufficiently finely form the modified region so that a single nucleus grows can be easily accomplished by a resist patterning or focusing the ion beam.

Si deposition method other than the CVD method

The method of growing a monocrystal by selectively forming a nucleus of Si is not limited to the CVD method. It is also possible to use a method whereby Si is evaporated in the vacuum (less than $10^{-6}$ Torr) by an electron gun and deposited onto the heated substrate. In particular, according to the MBE (Molecular Beam Epitaxy) method whereby the evaporation deposition is performed in the ultravacuum (less than $10^{-9}$ Torr), it is known that SiO₂ starts to react to the Si beam at a substrate temperature of 900° C. or more and a nucleus of Si is never formed on SiO₂ (T. Yonehara, S. Yoshioka, and S. Miyazawa, "JOURNAL OF APPLIED PHYSICS", Vol. 53, 10, page 6839, in 1983).

A single nucleus of Si was perfectly selectively formed on micro silicon nitride which had been formed as a spot layer on SiO₂ by use of the foregoing phenomenon, and a monocrystal of Si could be grown. In the deposition conditions at this time, the vacuum degree was $10^{-8}$ Torr or less, the intensity of Si beam was $9.7 \times 10^{14}$ atoms/cm².sec, and the substrate temperature was set to a value within a range from 900° to 1000° C.

In this case, the reactive product of SiO having a remarkably high vapor pressure is formed by the reaction of $$SiO_2 + Si \rightarrow 2SiO \uparrow$$

SiO₂ itself is etched by Si due to the evaporation.

On the other hand, the foregoing etching phenomenon does not occur on silicon nitride but a nucleus was formed and deposited.

Therefore, the similar effects can be also obtained by use of the deposition surface material having a high nucleation density such as tantalum oxide (Ta₂O₅) silicon nitride oxide (SiNO), etc. as well as silicon nitride. Namely, by finely forming these materials and using as the dissimilar materials, a monocrystal can be likewise grown.

By the monocrystal growth method which has been described in detail above, the monocrystalline semiconductor layer is formed on the separate layer 18.

As described in detail above, according to the complementary MOS integrated circuit device of the embodiments, the complementary MOS integrated circuit having a multi-layer structure can be constituted. The latch-up due to the complementary transistor can be suppressed. The degree of integration can be raised. The performance can be remarkably improved.

In the embodiments, since the monocrystalline semiconductor layer or substantially monocrystalline semiconductor layer is grown around the fine dissimilar material on the separate layer, no crystal lattice defect occurs, the diffusion of aluminum and impurities of the wiring electrode material, or the like is eliminated. The stable characteristic can be obtained.

Further, since the MOS transistor is formed in the monocrystalline semiconductor layer or substantially monocrystalline semiconductor layer, the excellent channel mobility which is almost equal to that of the MOS transistor formed on a monocrystalline wafer can be obtained. The high speed access can be realized.

What is claimed is:

1. A complementary MOS integrated circuit device comprising:
    a semiconductor substrate;
    a first MOS transistor of a first conductivity type formed on said substrate;
    an electrically insulating isolation layer covering said first MOS transistor;
    a nucleation surface of non-single-crystalline material provided on a surface of said isolation layer, comprising a material different from said isolation layer, having a nucleation density larger than said isolation layer, and having a sufficiently small area such that only a single nucleus can be formed thereon from which a single crystal is grown by a vapor crystal growth process;
    a single crystal semiconductor layer growing along and covering said nucleation surface;
    a second MOS transistor of a second conductivity type formed on said single crystal semiconductor layer, said second conductivity type is opposite to the first conductivity type; and
    an electrical connection means for electrically connecting said first MOS transistor with said second MOS transistor through said isolation layer.

2. A device according to claim 1, wherein said nucleation surface is made of polycrystalline material.

3. A device according to claim 1, wherein the nucleation density of said nucleation surface is at least $10^3$ times greater than the nucleation density of electrically insulting isolation layer.

4. A method of producing a complementary MOS integrated circuit device comprising the steps of:
    covering a first MOS transistor of a first conductivity type provided on a semiconductor substrate with an electrically insulating isolation layer;
    providing a nucleation surface of non-single-crystalline material having a nucleation density larger than the surface of the electrically insulating isolation layer on the electrically insulating isolation layer, the nucleation surface having a sufficiently small area that only a single nucleus can be formed thereon from which a single crystal is grown;
    forming a single-crystal semiconductor layer by a vapor crystal growth process; and
    forming a second MOS transistor of second conductivity type, opposite to the first conductivity type, within the single-crystal semiconductor layer.

5. A method according to claim 4, wherein the nucleation surface is made of polycrystalline material.

6. A method according to claim 4, wherein the crystal growth process is a chemical vapor deposition process.

7. A method according to claim 4, wherein the nucleation density of the nucleation surface is at least $10^3$ times greater than the nucleation density of the electrically insulating isolation layer.

8. A device according to claim 1, wherein said electrically insulating isolation layer comprises silicon oxide, and wherein said nucleation surface comprises silicon nitride.

9. A device according to claim 4, wherein said electrically insulating isolation layer comprises silicon oxide, and wherein said nucleation surface comprises silicon nitride.

10. A device according to claim 1, wherein said nucleation surface comprises a region made by modifying a material composition of said electrically insulating isolation layer.

11. A device according to claim 4, wherein said nucleation surface comprises a region made by modifying a material composition of electrically insulating isolation layer.

12. A device according to claim 1, wherein said nucleation surface comprises non-crystalline material.

13. A device according to claim 4, wherein said nucleation surface comprises non-crystalline material.

* * * * *